United States Patent
Endo et al.

(10) Patent No.: US 11,156,681 B2
(45) Date of Patent: Oct. 26, 2021

(54) NMR MEASUREMENT APPARATUS AND METHOD OF CONTROLLING ROTATION OF SAMPLE TUBE

(71) Applicant: JEOL Ltd., Tokyo (JP)

(72) Inventors: Yuki Endo, Tokyo (JP); Masahide Nishiyama, Tokyo (JP)

(73) Assignee: JEOL Ltd., Tokyo (JP)

( * ) Notice: Subject to any disclaimer, the term of this patent is extended or adjusted under 35 U.S.C. 154(b) by 28 days.

(21) Appl. No.: 16/720,824

(22) Filed: Dec. 19, 2019

(65) Prior Publication Data

US 2020/0200843 A1 Jun. 25, 2020

(30) Foreign Application Priority Data

Dec. 25, 2018 (JP) .............................. JP2018-240908

(51) Int. Cl.
*G01V 3/00* (2006.01)
*G01R 33/30* (2006.01)

(52) U.S. Cl.
CPC ................. *G01R 33/307* (2013.01)

(58) Field of Classification Search
CPC .... G01R 33/307; G01R 33/30; G01R 33/302; G01R 33/305; G01N 24/08
USPC ......................................................... 324/321
See application file for complete search history.

(56) References Cited

U.S. PATENT DOCUMENTS

| | | | |
|---|---|---|---|
| 4,806,868 A | 2/1989 | Schulke | |
| 5,340,452 A * | 8/1994 | Brenner | ........... G01N 27/44743 204/453 |
| 5,729,142 A * | 3/1998 | Baltusis | ............... G01R 33/307 324/321 |
| 5,754,048 A | 5/1998 | Bielecki | |
| 2004/0214196 A1 * | 10/2004 | Aydin | .................. C12Q 1/6827 435/6.12 |
| 2011/0241674 A1 * | 10/2011 | Endo | .................... G01R 33/307 324/309 |
| 2013/0307543 A1 | 11/2013 | Endo | |
| 2014/0216413 A1 | 8/2014 | Ozawa | |

(Continued)

FOREIGN PATENT DOCUMENTS

| | | |
|---|---|---|
| JP | H06235760 A | 8/1994 |
| JP | H06249935 A | 9/1994 |
| JP | 2892364 B2 | 2/1999 |

(Continued)

OTHER PUBLICATIONS

Tsukada, Kiyotaka, JP-03263397-A, Publication Year: Oct. 11, 1991 (Year: 1991).*

(Continued)

*Primary Examiner* — Walter L Lindsay, Jr.
*Assistant Examiner* — Frederick Wenderoth
(74) *Attorney, Agent, or Firm* — The Webb Law Firm

(57) ABSTRACT

A rotational force is applied to a sample tube by blowing of a drive gas to the sample tube. A spinning frequency of the sample tube is sequentially detected as a detection value. Acceleration control to gradually increase a pressure of the drive gas is executed until the detection value reaches a target value. In a process of the acceleration control, abnormality is determined based on a change with respect to time (difference: $\Delta F$) of the detection value. The determination is executed in a section of interest including a resonance frequency.

9 Claims, 7 Drawing Sheets

(56) References Cited

U.S. PATENT DOCUMENTS

2014/0312900 A1    10/2014  Ozaku et al.

FOREIGN PATENT DOCUMENTS

| JP | 200835925   A | 2/2008  |
| JP | 2012246864  A | 12/2012 |
| JP | 2014211321  A | 11/2014 |
| JP | 201575406   A | 4/2015  |
| JP | 2017116322  A | 6/2017  |

OTHER PUBLICATIONS

Extended European Search Report issued in EP19219116.1 dated Jun. 18, 2020.
Office Action issued in JP2018-240908 dated Dec. 15, 2020.

* cited by examiner

NMR MEASUREMENT APPARATUS AND METHOD OF CONTROLLING ROTATION OF SAMPLE TUBE

CROSS REFERENCE TO RELATED APPLICATION

This application claims priority to Japanese Patent Application No. 2018-240908 filed on Dec. 25, 2018, the disclosure of which is hereby incorporated by reference in its entirety.

BACKGROUND

Field of the Invention

The present disclosure relates to an NMR measurement apparatus and a method of controlling rotation of a sample tube.

Description of Related Art

In an NMR (Nuclear Magnetic Resonance) measurement for a solid sample, a MAS (Magic-Angle Spinning) method is used. Specifically, while a sample tube containing a sample is inclined by a predetermined angle (which is also called "magic angle") with respect to a direction of a static magnetic field, the sample tube is rotated (spun) and the NMR occurring in the sample is observed. As the sample tube, various sample tubes are commercialized. In particular, in recent years, sample tubes having a very small diameter are commercialized.

JP 2017-116322 A discloses a spinner (sample rotation mechanism) placed in an NMR probe. The spinner has a gas bearing structure and a turbine mechanism. The gas bearing structure normally comprises a plurality of gas bearings, and bearing gas is supplied to the plurality of gas bearings from the outside. The turbine mechanism blows drive gas which is supplied from the outside onto a turbine blade array formed in the sample tube. The gas bearing is typically an air bearing.

JP 2014-211321 A discloses a mechanism which detects a spinning frequency of a sample tube in an NMR measurement apparatus. JP 2892364 B discloses a resonance phenomenon when a rotation element which is held by a gas bearing is rotationally driven. However, JP 2892364 B does not describe any items related to the NMR measurement.

When the sample tube is rotationally driven by the spinner in the NMR measurement, if the spinning frequency of the sample tube matches a predetermined spinning frequency (resonance frequency), vibration is caused in the sample tube. As vibration modes in this case, for example, a cylindrical mode and a conical mode can be exemplified. Upon occurrence of the vibration mode, if an amount of displacement (an amount of deviation of an actual rotational axis from a proper rotational axis) of the spinner is increased, the sample tube may contact the spinner, which increases a risk of damages to the sample tube. In consideration of this, a configuration may be considered in which the amount of displacement of the sample tube is measured, and the rotational driving of the sample tube is stopped when the amount of displacement reaches a certain value. However, in many cases, it is not possible to provide a space for placing a device for measuring the amount of displacement inside or outside of the spinner. Prevention of occurrence of excessive vibration in the sample tube without the use of a complex structure is desired.

An advantage of the present disclosure lies in enabling detection of an excessive vibration in the sample tube before the excessive vibration actually occurs. Alternatively, another advantage of the present disclosure lies in determining an increase in the amount of displacement of the sample tube with a simple structure, and in handling the increase in the amount of displacement.

SUMMARY

According to one aspect of the present disclosure, there is provided an NMR measurement apparatus comprising: a spinner that has a gas bearing structure which holds a sample tube which contains a sample which is a target of NMR measurement, and that applies a rotational force to the sample tube by blowing of a drive gas to the sample tube; a detector that detects a spinning frequency of the sample tube as a detection value; and a controller that executes acceleration control to gradually increase a pressure of the drive gas until the detection value reaches a target value, wherein the controller comprises: a determination unit which determines abnormality based on a change with respect to time of the detection value in a process of the acceleration control; and a stop controller which stops the acceleration control when the abnormality is determined.

According to another aspect of the present disclosure, there is provided a method of controlling a rotation of a sample tube, comprising: sequentially detecting, in a situation where a rotational force is applied to a sample tube, which contains a sample which is a target of NMR measurement, by blowing of a drive gas to the sample tube, spinning frequency of the sample tube as a detection value; executing acceleration control to gradually increase a pressure of the drive gas until the detection value reaches a target value; determining abnormality based on the detection value when the detection value belongs to a section of interest which is a frequency band including a resonance frequency of the sample tube in a process of the acceleration control; and stopping the acceleration control when the abnormality is determined.

BRIEF DESCRIPTION OF DRAWINGS

Embodiment(s) of the present disclosure will be described based on the following figures, wherein.

DESCRIPTION OF THE INVENTION

Figure 1:
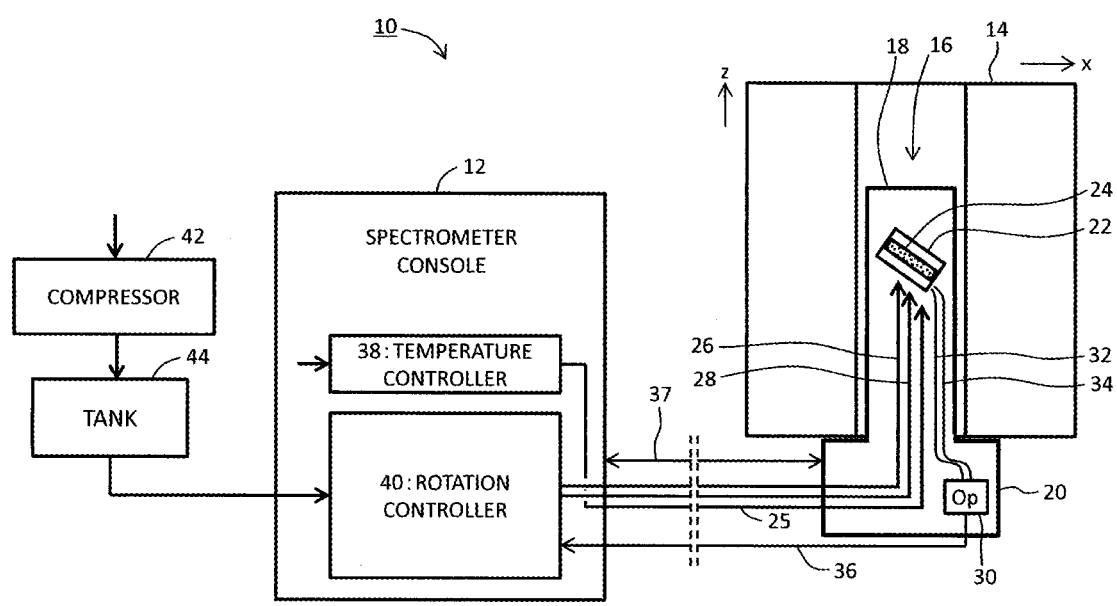
FIG. 1 is a block diagram showing an example structure of an NMR measurement apparatus according to an embodiment of the present disclosure.

An embodiment of the present disclosure will now be described with reference to the drawings.

(1) Overview of Embodiment(s)

According to an embodiment of the present disclosure, an NMR measurement apparatus comprises a spinner, a detector, and a controller. The spinner has a gas bearing structure which holds a sample tube which contains a sample which is a target of NMR measurement. The spinner applies a rotational force to the sample tube by blowing of drive gas to the sample tube. The detector detects a spinning frequency of the sample tube as a detection value. The controller executes acceleration control to gradually increase a pressure of the drive gas until the detection value reaches a target value. The controller has a determination unit and a stop controller. The determination unit determines abnormality based on a change with respect to time of the detection value in the process of the acceleration control. The stop controller stops the acceleration control when abnormality is determined. In an embodiment of the present disclosure, the above-described controller is formed from a processor.

During the process of the acceleration control, if vibration occurs in the sample tube (in particular, when an amplitude increase occurs due to resonance), even when the pressure of the drive gas is increased, an amount of change with respect to time of the detection value (spinning frequency) becomes small or the detection value does not change with respect to time. The reason for this may be considered to be possibility of consumption of the energy of the drive gas as the energy of the vibration, and possibility of contact of the sample tube with the spinner. In the above-described structure, abnormality is determined when such a phenomenon occurs, and the acceleration control is stopped. With this configuration, the sample tube can be protected. An amount of displacement by resonance depends on a state of the sample in the sample tube. When the abnormality is determined, the state of the sample in the sample tube may be changed as necessary (for example, a filling rate is increased), and the sample tube may be again set with respect to the spinner. In this sense, the above-described structure provides a user with an opportunity to make the state of the sample appropriate.

According to an embodiment of the present disclosure, the determination unit determines the abnormality when the detection value is in a section of interest on a spinning frequency axis in the process of the acceleration control. On the spinning frequency axis, a section where a vibration phenomenon such as the resonance occurs may be approximately identified in advance. A frequency band in which such a phenomenon occurs may be set as the section of interest, the abnormality may be determined in the section of interest, and execution of the determination of the abnormality may be prohibited outside of the section of interest, so that execution of unnecessary stopping control due to an error or the like may be prevented. Further, a determination dedicated to a particular phenomenon such as resonance can be realized. Alternatively, a plurality of sections of interest may be set on the spinning frequency axis. In this case, the abnormality determination condition may be switched for each section of interest.

According to an embodiment of the present disclosure, the determination unit limits the determination of the abnormality based on the detection value when the target value is in the section of interest. In general, when the detection value becomes close to the target value, acceleration is weakened, and is finally set to zero. In this situation, the change with respect to time of the detection value is reduced, and becomes zero at the end. The above-described structure limits the determination of the abnormality so as to prevent erroneous determination of the abnormality in such circumstances. For example, a configuration may be employed in which the determination of abnormality is not executed at all when the target value is within the section of interest. In this case, the occurrence of the vibration may be determined by a method other than that described above. Alternatively, a configuration may be employed in which the determination of abnormality is not executed only when the detection value becomes close to or equal to the target value.

According to an embodiment of the present disclosure, the NMR measurement apparatus includes a decider which adaptively decides the section of interest based on an attribute of the sample tube. Because the resonance frequency of the sample tube varies depending on an attribute of the sample tube such as the diameter, the section of interest may be adaptively set according to the attribute of the sample tube. Alternatively, a plurality of resonance frequencies may be included in the section of interest.

According to an embodiment of the present disclosure, in the process of the acceleration control, a pressure of a bearing gas which is supplied to the gas bearing structure is maintained in the section of interest. In general, in the process of increasing the pressure of the drive gas, the pressure of the bearing gas is also increased. However, when the pressure of the bearing gas is changed, the resonance condition may vary. Thus, in the above-described structure, in order to prevent inadvertent variation of the presumption of the abnormality determination in the section of interest, the pressure of the bearing gas is maintained.

According to an embodiment of the present disclosure, the determination unit has a difference calculator, a comparator, a counter, and a determiner. The difference calculator calculates a difference between two detection values which are separated in time. The comparator compares the difference to a first threshold. The counter counts a number of consecutive occurrences of an event where the difference is smaller than the first threshold. The determiner determines the abnormality when the number of consecutive occurrences has reached a second threshold. Desirably, a configuration is employed in which the first threshold and the second threshold are variable according to the circumstances.

According to an embodiment of the present disclosure, the controller executes deceleration control to reduce the pressure of the drive gas. The determination unit does not execute the determination of the abnormality based on the detection value in a process of the deceleration control. When the abnormality is not determined in the process of the acceleration control which is executed beforehand, occurrence of an excessive vibration in the process of the subsequent deceleration control cannot be expected. From this perspective, in the above-described structure, the process is simplified in the process of the deceleration control. Alternatively, a configuration may be employed in which determination of excessive vibration is executed in the process of the deceleration control, according to a certain circumstance.

A method of controlling a rotation of a sample tube according to an embodiment of the present disclosure comprises a detection step, an execution step, a determination step, and a stopping step. In the detection step, a spinning frequency of a sample tube, which contains a sample which is a target of NMR measurement, is detected as a detection value while a rotational force is applied to the sample tube by blowing of a drive gas to the sample tube. In the execution step, acceleration control to gradually increase a pressure of the drive gas is executed until the detection value reaches a target value. In the determination step, abnormality is determined based on the detection value when the detection value belongs to a section of interest which is a frequency band including a resonance frequency of the sample tube in a process of the acceleration control. In the stopping step, when the abnormality is determined, the acceleration control is stopped.

According to the above-described structure, at the time when the excessive vibration occurs due to the resonance, the excessive vibration can be determined to be an abnormality. The abnormality may be determined from a size of the detection value itself, or from a size of the change with respect to time of the detection value. By referring to the change with respect to time of the detection value, the occurrence of the excessive vibration can be determined quickly and with a high level of sensitivity. Alternatively, information other than the detection value may be referred to along with the detection value.

The above-described method may be realized as a function of hardware or as a function of software. In the case of the latter, a program for executing the method of controlling the rotation of the sample tube is installed to an information processor device via a network or via a transportable recording medium. The information processor device corresponds to, for example, the controller in the NMR measurement apparatus.

(2) Details of Embodiment(s)

FIG. 1 shows an example structure of an NMR measurement apparatus according to an embodiment of the present disclosure. The NMR measurement apparatus 10 is an apparatus which measures NMR caused in the sample, and comprises a spectrometer console 12, a static magnetic field generator 14, and an NMR measurement probe 16. In the present embodiment, the sample is a solid sample, and is, for example, a powder-form sample.

The static magnetic field generator 14 is a device which generates a static magnetic field, and has a bore serving as a cavity. The NMR measurement probe 16 has an insertion portion 18 which is inserted into the bore, and a base portion 20 continuous from the insertion portion 18. A tip (upper end) of the insertion portion 18 is also called a probe head, and a spinner 22 serving as a sample tube rotation mechanism is placed therein. As will be described later, the spinner 22 has a gas bearing structure and a turbine mechanism.

The gas bearing structure includes two gas bearings which hold a sample tube 24. The sample tube 24 is rotatably held by the gas bearing structure. A pipe 28 is connected to the gas bearing structure. Bearing gas is supplied to the gas bearing structure through the pipe 28. The turbine mechanism applies a rotational force to the sample tube 24 by blowing drive gas onto the sample tube 24. The drive gas is supplied to the turbine mechanism through a pipe 26. A pipe 25 is also connected to the spinner 22. The pipe 25 is for supplying gas for adjusting temperature of the sample to the spinner 22.

A light emission receiver unit 30 and optical fibers 32 and 34 function as a rotation (spinning frequency) detector. The light emission receiver unit 30 is provided inside the base portion 20, and has a light emitter and a light receiver. The two optical fibers 32 and 34 are provided between the spinner 22 and the light emission receiver unit 30. The light generated by the light emitter is guided to an inside of the spinner 22 by the optical fiber 32. An emission end surface of the optical fiber 32 is directed to a side surface of the sample tube 24, and light exiting the emission end surface is illuminated to the side surface of the sample tube 24. An incidence end surface of the optical fiber 34 is directed to the side surface of the sample tube 24, and reflected light from the side surface of the sample tube 24 enters the optical fiber 34 through the incidence end surface. The light is guided to the light emission receiver unit 30 via the optical fiber 34. The light emission receiver unit 30 outputs a detection signal to a rotation controller 40. Reference numeral 36 shows a signal wiring through which the detection signal is transmitted. The detection signal is a signal indicating a spinning frequency (a rotation rate or a rotational frequency). Alternatively, a structure other than that described above may be employed as the rotation detector. In addition, in the above, a configuration is described in which two optical fibers 32 and 34 are used, but alternatively, the optical fibers may be integrated to form a single optical fiber, in which case the incidence and emission occur on the same end surface.

The spectrometer console 12 has, in addition to a spectrometer, a temperature controller 38 and the rotation controller 40. The spectrometer has a transmitter, a receiver, a signal analyzer, or the like. A transmission signal is supplied from the transmitter to a detection coil in the NMR measurement probe 16. With this process, NMR is generated in the sample by an electromagnetic wave generated in the detection coil. With the NMR, an NMR signal is induced in the detection coil. The NMR signal is sent to a receiver as a reception signal. At the receiver, the reception signal is processed, and the signal analyzer generates a reception signal spectrum based on the processed reception signal. Reference numeral 37 shows a transmission signal wiring and a reception signal wiring provided between the spectrometer console 12 and the NMR measurement probe 16.

The temperature controller 38 supplies, to the spinner 22, a temperature adjustment gas for heating or cooling the sample to a predetermined temperature. The rotation controller 40 controls rotation of the sample tube 24 at the spinner 22. The drive gas and the bearing gas are supplied from the rotation controller 40 to the spinner. The pressures of these gases are controlled by the rotation controller 40. When the pressure of the drive gas is increased, the sample tube 24 rotates at a higher speed, and when the pressure of the drive gas is reduced, the rotational rate of the sample tube 24 is also reduced. In the present embodiment, in the process of continuously increasing the pressure of the drive gas, the pressure of the bearing gas is increased stepwise. The rotation controller 40 is formed from, for example, one or more processors executing one or more programs. As the one or more processors, devices such as CPU, GPU, FPGA, ASIC, and the like may be exemplified.

A constant gas pressure is generated by a compressor 42, and gas is supplied from the compressor 42 to the rotation controller 40 via a tank 44. As the gas, air, inert gas, or the like may be exemplified. The rotation controller 40 will be described later in detail. When the air is used as the gas, the gas bearing structure is called an air bearing structure.

Figure 2:
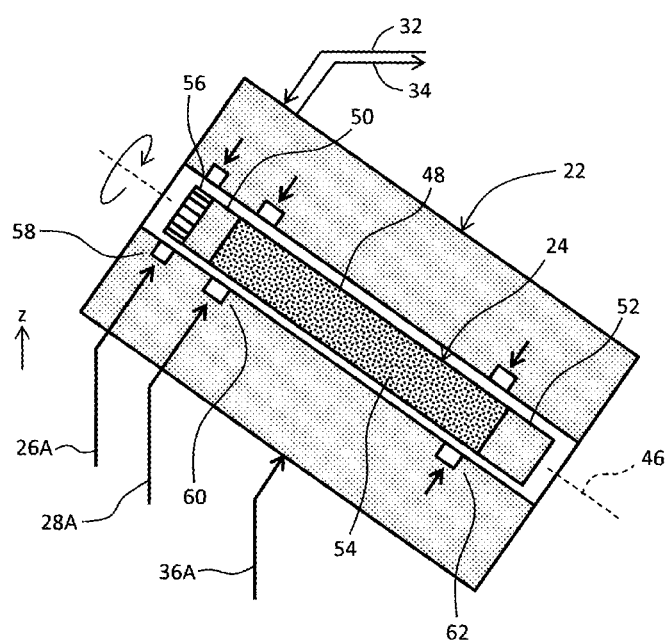
FIG. 2 is a schematic diagram showing an example of a spinner.

FIG. 2 schematically shows a cross section of the spinner 22. A gas flow path inside the spinner 22 is not shown in the drawing. The sample tube 24 has a tubular form, and comprises a body 48 and two caps 50 and 52. A sample 54 is contained in a space inside the body 48 and sandwiched between the two caps 50 and 52. A center axis 46 of the sample tube 24 is inclined by a magic angle (approximately 54.7 degrees) with respect to a z axis (the direction of the static magnetic field). A diameter of the sample tube 24 is, for example, typically 1.0~3.0 mm. Alternatively, the diameter may be 0.5~1.0 mm.

The spinner 22 has a hollow portion, and the sample tube 24 is placed therein. The spinner 22 has a bearing structure, which specifically comprises two gas bearings 60 and 62. Each of the gas bearings 60 and 62 has a plurality of gas blow-out ports arranged in an annular shape. A number of the gas blow-out ports is, for example, 6~10. Bearing gas 28A is blown out from these gas blow-out ports, and onto a side surface of the sample tube 24, so that the sample tube 24 is held with respect to the spinner 22 in a non-contacting manner. A gap (clearance) between the sample tube 24 and an inner wall of the spinner 22 is, for example, 20~30 μm.

A turbine mechanism 58 has a plurality of gas blow-out ports arranges in an annular shape. Drive gas 26A is blown out from these gas blow-out ports, and onto a turbine blade array 56 formed on the cap 50 so that a rotational force is applied to the sample tube 24. As already described, the optical fibers 32 and 34 are connected to the spinner 22.

Figure 3:
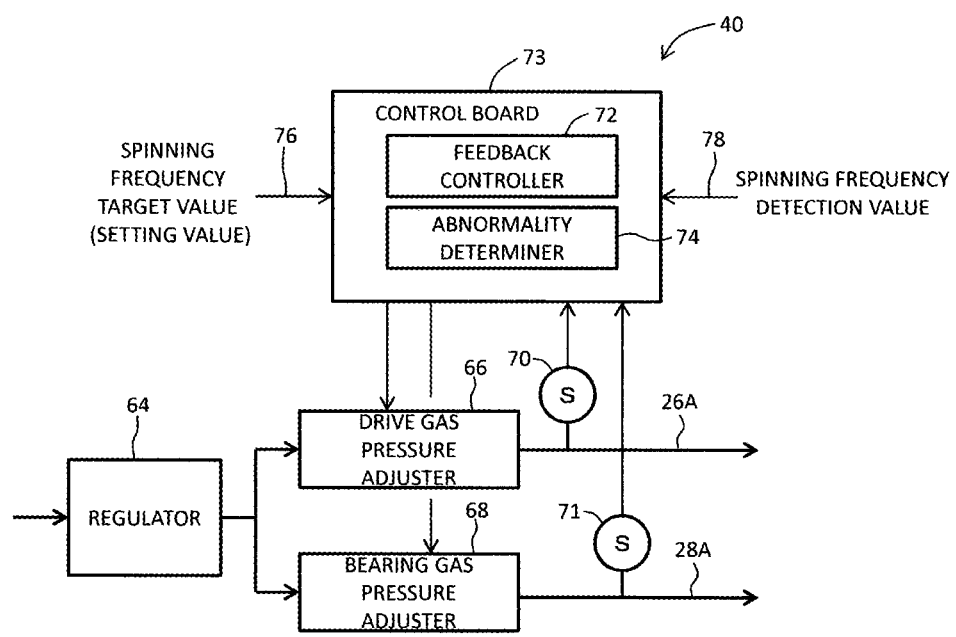
FIG. 3 is a block diagram showing an example structure of a rotation controller.

FIG. 3 shows an example structure of the rotation controller 40 shown in FIG. 1. Gas supplied from the compressor side is sent to a drive gas pressure adjuster 66 and to a bearing gas pressure adjuster 68 through a regulator 64. Each of the pressure adjusters 66 and 68 adjusts the gas pressure, and specifically comprises a proportional-control type electromagnetic valve. The drive gas 26A exiting the drive gas pressure adjuster 66 is sent to the spinner. The bearing gas 28A exiting the bearing gas pressure adjuster 68 is also sent to the spinner. A pressure sensor 70 is provided on a pipe through which the drive gas 26A flows. A detection signal from the pressure sensor 70 is provided to a control board 73. Similarly, a pressure sensor 71 is provided on a pipe through which the bearing gas 28A flows, and a detection signal from the pressure sensor 71 is provided to the control board 73.

In the example structure shown in the figure, the control board 73 has a feedback controller 72 and an abnormality determiner 74. Alternatively, these elements may be formed by a single processor. Alternatively, the plurality of functions of the control board 73 may be realized by an information processor device. The feedback controller 72 executes an acceleration control to gradually increase the pressure of the drive gas 26A so that a spinning frequency detection value (hereinafter also referred simply as "detection value") matches a spinning frequency target value (hereinafter also referred simply as "target value") serving as a setting value after the rotation is started. Subsequent to such acceleration control, the feedback controller 72 executes constant-rate control and deceleration control. The target value is set by a user or automatically. The feedback controller 72 also has a function to control the pressure of the bearing gas. In the process of the acceleration control described above, the pressure of the bearing gas is increased stepwise.

In the present embodiment, the abnormality determiner 74 determines abnormality based on a change with respect to time of the spinning frequency in the process of the acceleration control; in particular, in a section of interest (frequency band of interest). When abnormality is determined, the feedback controller 72 stops the rotational drive or executes the deceleration control. Employment of such a stopping control can avoid occurrence of problems such as contact of the sample tube with the spinner or damages to the sample tube caused by the excessive vibration due to resonance in the process of increasing the spinning frequency of the sample tube. After the rotation of the sample tube is stopped, the sample tube is taken out from the spinner as necessary, and the state of the sample in the sample tube is changed. Then, the sample tube is again set on the spinner and the acceleration control is again executed.

Figure 4:
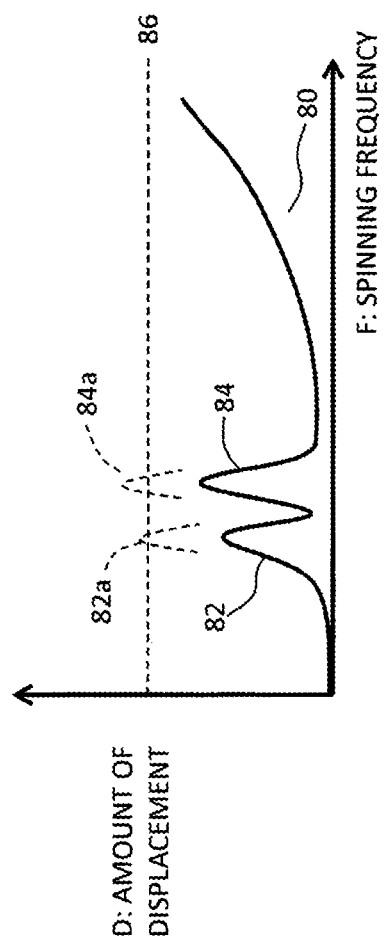
FIG. 4 is a diagram showing a relationship between a spinning frequency and an amount of displacement.
Figure 5:
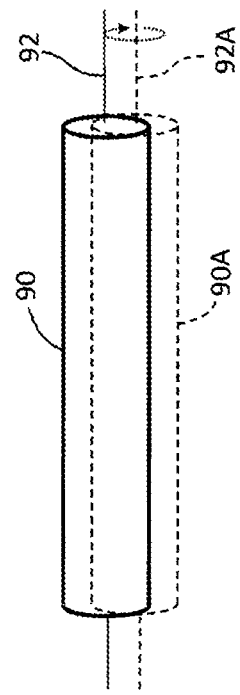
FIG. 5 is a diagram showing a cylindrical mode.

FIG. 4 shows a relationship between the spinning frequency and displacement (amount of displacement). In a displacement characteristic 80, two resonance peaks 82 and 84 can be recognized. The resonance peak 82 is caused, for example, when a cylindrical mode is caused as the vibration mode. FIG. 5 schematically shows the cylindrical mode. Reference numeral 90A shows the sample tube when the displacement is zero, and reference numeral 92A shows a center axis in this case (which matches a geometric center axis of the spinner). In the cylindrical mode, the actual center axis 92 of the sample tube 90 moves in a cylindrical trajectory around the center axis of the bearing.

Figure 6:
FIG. 6 is a diagram showing a conical mode.

In FIG. 4, the resonance peak 84 is caused when, for example, a conical mode is caused as the vibration mode. FIG. 6 schematically shows the conical mode. Reference numeral 96A shows the geometric center axis of the spinner. In the conical mode, ends of the sample tube 94 are both turned and moved (precession). Whether the cylindrical mode first occurs or the conical mode first occurs before the other mode in the process of the acceleration control depends on the form of the sample tube or the like.

In FIG. 4, reference numeral 86 shows a level corresponding to the clearance. In the process of the acceleration control, if the heights of the two resonance peaks 82 and 84 appropriately limited, the contact of the sample tube with the spinner does not occur. On the other hand, when the heights of the peaks are increased as shown by reference numerals 82*a* and 84*a*; that is, when excessive vibration is caused, the contact of the sample tube with the spinner occurs, and a risk of damages to the sample tube or the like is increased. In consideration of this, a configuration may be considered in which a threshold for the displacement is set, and, when the displacement exceeds the threshold, transfer of the rotational force to the sample tube is stopped. However, when such a structure is employed, a detector must be placed for measuring the amount of displacement inside or outside of the spinner. In many cases, securing the placement space for the detector is difficult, and there also is a problem in that placement, near the sample, of a member which affects the magnetic field is not desirable. Thus, it is desired to detect excessive vibration due to resonance as simply as possible, possibly by using the already-existing structures.

Figure 7:
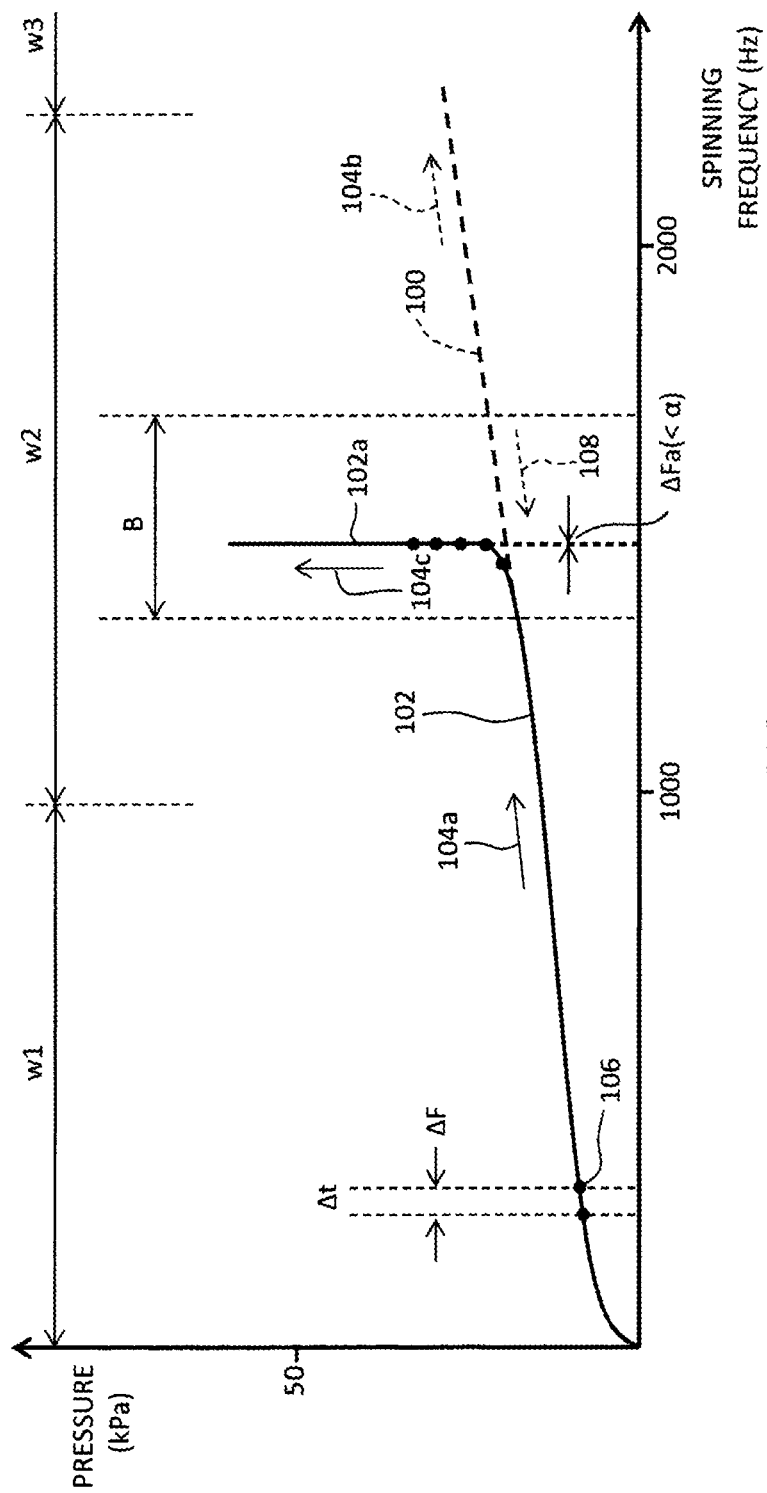
FIG. 7 is a diagram showing a relationship between a spinning frequency and a pressure of a drive gas in a process of acceleration control.

An abnormality detection method according to the present embodiment will now be described based on FIG. 7. In FIG. 7, a horizontal axis shows the spinning frequency. That is, the horizontal axis is the spinning frequency axis. A vertical axis shows the pressure of the drive gas. After the rotation is started, the acceleration control to gradually increase the pressure of the drive gas is executed by the feedback controller until the detection value (spinning frequency) reaches the target value (setting value).

A characteristic 100 is a normal characteristic in which there is no abnormality. That is, in the process of the acceleration control, the spinning frequency increases approximately linearly. An arrow 104*b* shows a direction of change. On the other hand, a characteristic 102 is a non-normal characteristic caused in the process of the acceleration control, and has a steep rise portion 102*a*. Arrows 104*a* and 104*c* respectively show directions of change.

The rise portion 102*a* may be considered to be reflecting a situation where, even with the increase in the pressure of the drive gas, the spinning frequency is not increased because a movement other than rotation (that is, vibration due to resonance) is caused by the cylindrical mode or the conical mode, and the sample tube has contacted the spinner due to the increase of amplitude of the vibration. The situation may also be said to be a state in which the increase in the pressure contributes to an increase in the amplitude of the vibration, rather than to an increase in the spinning frequency.

In the rotational control, the spinning frequency is sampled at a certain sampling period. That is, a plurality of detection values are sequentially acquired on the time axis. Reference numeral 106 shows one sampling timing. A period between two sampling timings adjacent in time is a sampling period Δt. A difference between two detection values (difference between two numbers of rotations) separated by the sampling period Δt is ΔF. The difference ΔF is calculated for each sampling timing. In the characteristic 102, the difference ΔF is relatively large in the portion where the characteristic is gently inclined. On the other hand, the difference ΔF is rapidly reduced at the rise portion 102a, and the difference ΔF then becomes approximately zero (referred to as ΔFa). This is an abnormal state in which, even though the pressure of the drive air is increased, the spinning frequency is not increased, and the amplitude is increased by a particular vibration mode.

In the present embodiment, the difference ΔF is compared to a threshold a in a section of interest B on the spinning frequency axis; that is, when the detection value which is detected belongs to the section of interest B. When the difference ΔF is smaller than the threshold a, the abnormality is determined.

The section of interest B is a section where the vibration mode is caused; that is, where the resonance is caused, or, in other words, a section including the resonance frequency. Alternatively, the section of interest B may be set as a section including a plurality of resonance frequencies. Alternatively, a plurality of sections of interest corresponding to a plurality of resonance frequencies may be set on the spinning frequency axis. According to the setting of the section of interest, abnormality determination is enabled which is dedicated to resonance. In addition, it becomes possible to avoid unnecessary determination of the abnormality in sections other than the section of interest. As shown in FIG. 7, according to the difference ΔF, the abnormality can be determined with superior responsiveness and superior sensitivity. The section of interest B shown in FIG. 7 is merely exemplary, and, alternatively, a wider section of interest or a narrower section of interest may be set.

Alternatively, as will be described later, a configuration may be employed in which a case where the difference ΔF is smaller than the threshold is set as one event, and the abnormality is determined when the event is consecutively continued for n times. Here, n is an integer greater than or equal to 1. By varying the value of n, it becomes possible to easily distinguish a phenomenon which is permitted and a phenomenon which is regarded as an abnormality. Alternatively, the difference ΔF may be calculated between two detection values separated by a period which is m times the sampling period. Here, m is an integer greater than or equal to 1. By varying the value of m, responsiveness may be adjusted. Alternatively, the sampling period itself may be adjusted.

In the present embodiment, when the abnormality is determined, the acceleration control is immediately stopped. In this case, the pressure of the drive air may be gradually reduced or the supply of the drive air may be immediately stopped. In either case, according to the present embodiment, excessive displacement due to the resonance can be avoided, and, consequently, the risk of the damages to the sample tube or the like can be reduced. From another viewpoint, according to the present embodiment, it becomes possible to provide the user with an opportunity to change the manner of filling of the sample.

In the present embodiment, in the process of the acceleration control, the above-described abnormality determination is not executed in sections other than the section of interest. Alternatively, vibration may be monitored by another method in the section of interest or outside of the section of interest. As shown by reference numeral 108 in FIG. 7, in the process of the deceleration (deceleration control), the above-described abnormality determination is not executed. This is because, when the acceleration control is already executed and no abnormality is determined in the process of the acceleration control, occurrence of the abnormality in the subsequent process of deceleration cannot be expected. In the process of the deceleration, even if the resonance peak as shown in FIG. 4 occurs, the height thereof would be smaller than the peak occurring in the process of the acceleration control. By omitting the abnormality determination in the period which does not need to be monitored, it is possible to correspondingly simplify the control, and to thereby reduce the load of the controller.

The target value of the spinning frequency may be set for a wide range on the spinning frequency axis according to an object of the measurement and the sample. For example, the target value may be set in the range from a few Hz to 200 kHz. As already described, in the acceleration control, the pressure of the bearing gas is increased stepwise. In FIG. 7, a plurality of sections in which the pressure of the bearing gas is maintained are shown by w1, w2, w3, . . . . The pressure of the bearing gas is increased by one step between adjacent sections. The section of interest B is included in the section w2. In other words, the pressure of the bearing gas is maintained constant in the section of interest B. If the pressure of the bearing gas is changed in the section of interest B, the resonance condition would change, and there is a possibility that appropriate execution of the abnormality determination becomes impossible. In order to avoid such a problem, the change of the bearing gas pressure is limited in the section of interest B; that is, the bearing gas pressure is maintained in the section of interest B.

Figure 8:
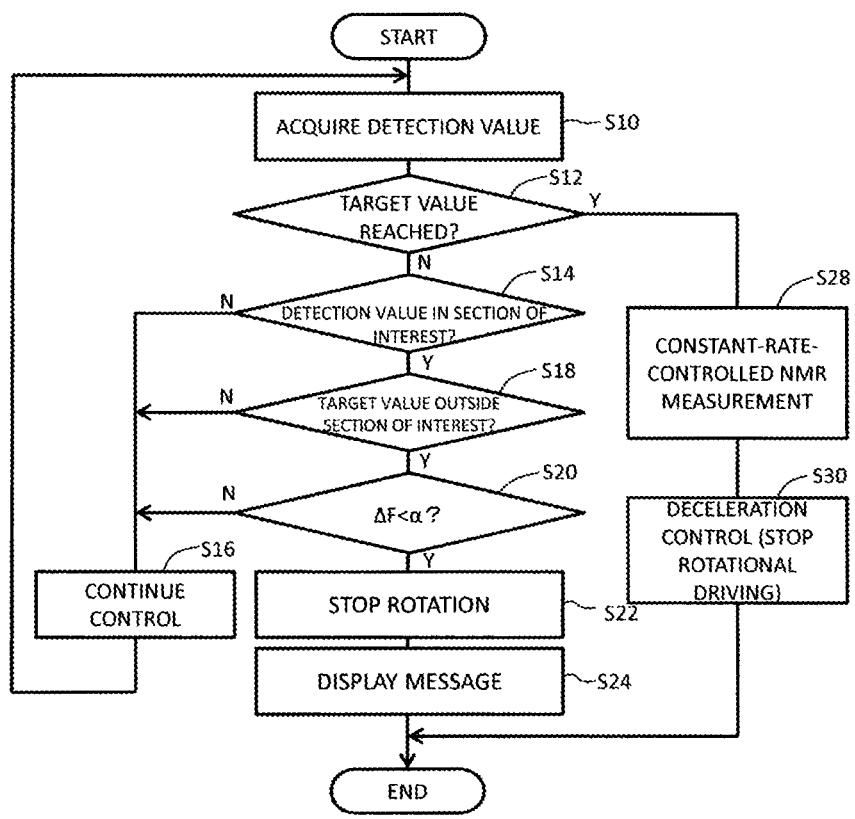
FIG. 8 is a flowchart showing an example operation of a rotation controller.

FIG. 8 shows, as a flowchart, a method of controlling the rotation of the sample tube according to the present embodiment. With the start of execution of the acceleration control, the blowing of the drive gas onto the sample tube is started; that is, the rotational driving of the sample tube is started. Then, with an increase of the pressure of the drive gas, the spinning frequency of the sample tube is gradually increased. In this process, processes of S10 and later steps are repeatedly executed.

In S10, a detection value (current detection value) is acquired. In reality, the detection values are sequentially acquired according to a sampling rate. In S12, it is judged whether or not the detection value acquired in S10 has reached the target value. When the detection value has reached the target value, in S28, the control changes from the acceleration control to the constant-rate control, and an NMR measurement is executed in this state. After the measurement is completed, in S30, the deceleration control is executed. In an event that a change occurs in a target spinning frequency in the constant-rate-controlled NMR measurement of S28, the process returns to the start, and the steps from the acquisition of the detection value of S10 are repeated.

When it is judged in S12 that the detection value has not reached the target value, in S14, it is judged whether or not the detection value belongs to the section of interest. When the detection value does not belong to the section of interest, the judgments of S18 and S20 are not executed, and continuation of the control executed until then is performed in S16. In other words, the acceleration control executed until then is continued. Then, the steps from S10 are again executed.

When it is judged in S14 that the current detection value belongs to the section of interest, in S18, it is judged whether or not the target value is outside the section of interest. When the target value is in the section of interest, there is a possibility of erroneous determination because the difference ΔF becomes small as the detection value becomes close to the target value. S18 is provided in consideration of this. If there is no possibility of such an erroneous determination, S18 may be omitted. When the judgment in S18 is No, the steps from S16 are executed.

Alternatively, when the target value is in the section of interest (in the case where S20 is bypassed), occurrence of the excessive vibration may be judged by another method. Alternatively, in the judgment of S18, reference may be made to a flag or the like indicating that the sample tube is in the middle of rotation. Alternatively, when a plurality of the sections of interest are provided, in S18, it may be judged whether or not the target value is outside the section of interest only for the section of interest to which the detection value belongs.

In S20, the difference ΔF is calculated between two detection values adjacent on the time axis (the current detection value and a previous detection value), and it is judged whether or not the difference ΔF is smaller than the threshold a. When the difference ΔF is not smaller than the threshold a, the steps from S16 are executed. When the difference ΔF is smaller than the threshold a; that is, when there is slowing down or reduction of the spinning frequency during the execution of the acceleration control, an abnormal situation of occurrence of the excessive vibration or contact of the sample tube with the spinner may be expected, and thus, S22 is executed. In S22, in order to handle the abnormality, the rotational driving is stopped. With this process, the spinning frequency of the sample tube is gradually reduced, and, after a while, the rotation is stopped. In S24, a message is displayed for the user. The message includes, for example, an indication that the rotation abnormality is determined and the rotational driving is automatically stopped, and an indication that the user is recommended to change the manner of filling of the sample in the sample tube, and to again attempt to rotationally drive the sample tube.

According to the above-described embodiment, when the abnormality of the rotation occurs, the abnormality can be quickly detected and the rotation of the sample tube can be stopped. Thus, the sample tube can be protected. The contents shown in FIG. 8 are merely exemplary, and may be suitably changed according to the structure of the actual NMR apparatus, the sample to be measured, an objective of the experiment, or the like.

Alternatively, in S20 described above, the difference ΔF may be calculated between two detection values separated by a period which is m times the sampling period. Here, m is an integer greater than or equal to 1, and may be set by the user or automatically. Alternatively, the sampling period itself may be designated by the value of m. Alternatively, a configuration may be employed in which, in S20 described above, the abnormality is determined when the event of the difference ΔF<threshold a occurs consecutively for n times. Here, n is a threshold, is an integer greater than or equal to 1, and may be set by the user or automatically. By varying m and n, the responsiveness and the sensitivity can be freely adjusted.

Figure 9:
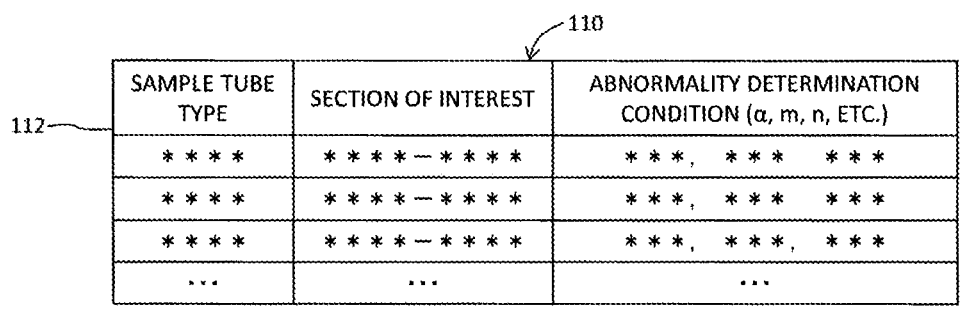
FIG. 9 is a diagram showing a table for deciding a section of interest and an abnormality determination condition according to a type of a sample tube.

Alternatively, the section of interest and the abnormality determination condition may be adaptively set for each type of the sample tube according to a table 110 shown in FIG. 9. The table 110 includes a plurality of records 112. The plurality of records 112 correspond to a plurality of types of the sample tube. According to the table 110, by designating a certain type of the sample tube (for example, diameter), the section of interest and the abnormality determination condition suited for the type of the sample tube can be specified. As the section of interest, an upper limit and a lower limit thereof may be designated. Alternatively, as the section of interest, the resonance frequency and a frequency width centered at the resonance frequency may be designated. As the abnormality determination condition, the values of a, n, and m may be specified.

Figure 10:
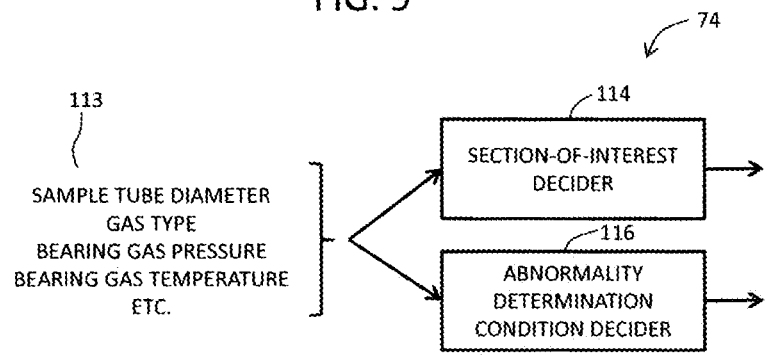
FIG. 10 is a diagram for explaining decision of a section of interest and an abnormality determination condition based on a group of parameters.

FIG. 10 shows a structure of a part of the abnormality determiner shown in FIG. 3. Reference numeral 113 shows a group of parameters, which include a sample tube diameter, a gas type, a bearing gas pressure, a bearing gas temperature, and the like. A section-of-interest decider 114 adaptively decides a section of interest based on the group of parameters 113. An abnormality determination condition decider 116 adaptively decides the abnormality determination condition (a, m, n, or the like) based on the group of parameters 113. The abnormality determiner shown in FIG. 3 has, in addition to these structures, a difference calculator which calculates a difference between two detection values, a comparative calculator which compares the difference to the threshold, a counter which counts a number of consecutive occurrences of the event where the difference is smaller than the threshold, a determiner which determines abnormality when the counted value has reached a certain value, or the like. These structures may be formed as hardware or realized as functions of software.

An alternative configuration may be considered in which the abnormality is determined based on the detection value itself, rather than the change with respect to time of the detection value. For example, a reference value corresponding to elapsed time from the start of execution of the acceleration control or a reference value corresponding to the pressure of the drive gas may be determined, and the detection value may be compared to the reference value to determine the abnormality. When such an alternative configuration is employed also, it is desirable to execute the determination of the abnormality caused by the resonance only for the section of interest including the resonance frequency.

The invention claimed is:

1. A nuclear magnetic resonance (NMR) measurement apparatus comprising:
   a spinner that has a gas bearing structure which holds a sample tube which contains a sample which is a target of NMR measurement, and that applies a rotational force to the sample tube by blowing of a drive gas to the sample tube;
   a detector that detects a spinning frequency of the sample tube as a detection value at each sampling timing; and
   a processor configured to execute acceleration control to gradually increase a pressure of the drive gas until the detection value reaches a target value, wherein
   the processor is configured to:
      sequentially calculate a difference between two detection values which are separated with respect to time to determine abnormality based on a change with respect to time of the detection value in a process of the acceleration control; and stop the acceleration control when the abnormality is determined.

2. The NMR measurement apparatus according to claim 1, wherein the processor is further configured to determine the abnormality when the detection value is in a section of interest on a spinning frequency axis in the process of the acceleration control.

3. The NMR measurement apparatus according to claim 2, wherein the processor is further configured to limit the determination of the abnormality when the detection value has reached the target value.

4. The NMR measurement apparatus according to claim 2, wherein the section of interest is a section including a resonance frequency of the sample tube.

5. The NMR measurement apparatus according to claim 4, wherein the processor is further configured to adaptively decide the section of interest based on an attribute of the sample tube.

6. The NMR measurement apparatus according to claim 2, wherein in the process of the acceleration control, a pressure of a bearing gas which is supplied to the gas bearing structure is maintained in the section of interest.

7. The NMR measurement apparatus according to claim 1, wherein the processor is further configured to:
compare the difference between the two detection values which are separated in time to a first threshold;
count a number of consecutive occurrences of an event where the difference is smaller than the first threshold; and
determine the abnormality when the number of consecutive occurrences has reached a second threshold.

8. The NMR measurement apparatus according to claim 1, wherein the processor is further configured to:
execute deceleration control to reduce the pressure of the drive gas; and
not execute the determination of the abnormality based on the detection value in a process of the deceleration control.

9. A method of controlling a rotation of a sample tube, comprising:

sequentially detecting, in a situation where a rotational force is applied to a sample tube, which contains a sample which is a target of NMR measurement, by blowing of a drive gas to the sample tube, a spinning frequency of the sample tube as a detection value at each sampling timing;

executing acceleration control to gradually increase a pressure of the drive gas until the detection value reaches a target value;

sequentially calculating a difference between two detection values which are separated with respect to time to determine abnormality based on the detection value when the detection value belongs to a section of interest which is a frequency band including a resonance frequency of the sample tube in a process of the acceleration control; and stopping the acceleration control when the abnormality is determined.

\* \* \* \* \*